(12) United States Patent
Muro

(10) Patent No.: US 8,758,028 B2
(45) Date of Patent: Jun. 24, 2014

(54) TELEVISION AND ELECTRONIC APPARATUS

(75) Inventor: Kiyomi Muro, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 60 days.

(21) Appl. No.: 13/533,754

(22) Filed: Jun. 26, 2012

(65) Prior Publication Data

US 2013/0122749 A1 May 16, 2013

(30) Foreign Application Priority Data

Nov. 10, 2011 (JP) ................................. 2011-246513

(51) Int. Cl.
*H01R 12/00* (2006.01)

(52) U.S. Cl.
USPC .......................................................... 439/67

(58) Field of Classification Search
USPC .................................................... 439/67, 77
See application file for complete search history.

(56) References Cited

U.S. PATENT DOCUMENTS

| | | | | |
|---|---|---|---|---|
| 4,526,432 A | * | 7/1985 | Cronin et al. | 439/320 |
| 5,205,741 A | * | 4/1993 | Steen et al. | 439/70 |
| 5,219,293 A | * | 6/1993 | Imamura | 439/67 |
| 7,484,967 B2 | | 2/2009 | Ichino et al. | |

FOREIGN PATENT DOCUMENTS

| | | |
|---|---|---|
| JP | 2001-318618 | 11/2001 |
| JP | 2002-324610 | 11/2002 |
| JP | 2003-069163 | 3/2003 |
| JP | 2003-101167 | 4/2003 |
| JP | 2007-123183 | 5/2007 |
| JP | 2007-194459 | 8/2007 |
| JP | 2008-300509 | 12/2008 |
| JP | 2010-010277 | 1/2010 |

OTHER PUBLICATIONS

Japanese Patent Application No. 2011-246513, First Office Action, mailed Aug. 21, 2012, (with English Translation).

* cited by examiner

*Primary Examiner* — Gary Paumen
(74) *Attorney, Agent, or Firm* — Blakely, Sokoloff, Taylor & Zafman LLP

(57) ABSTRACT

According to one embodiment, an electronic apparatus includes a housing, a connector, and a component connected to the connector. The component includes a first and third electrically conductive portion on a first surface, a second electrically conductive portion on a second surface, and a first and second cover portions. The second electrically conductive portion is connected to the first electrically conductive portion. The third electrically conductive portion is kept in contact with a terminal of the connector, and connected to the second electrically conductive portion. The first and second cover portions cover at least a part of the first and second electrically conductive portion.

17 Claims, 8 Drawing Sheets

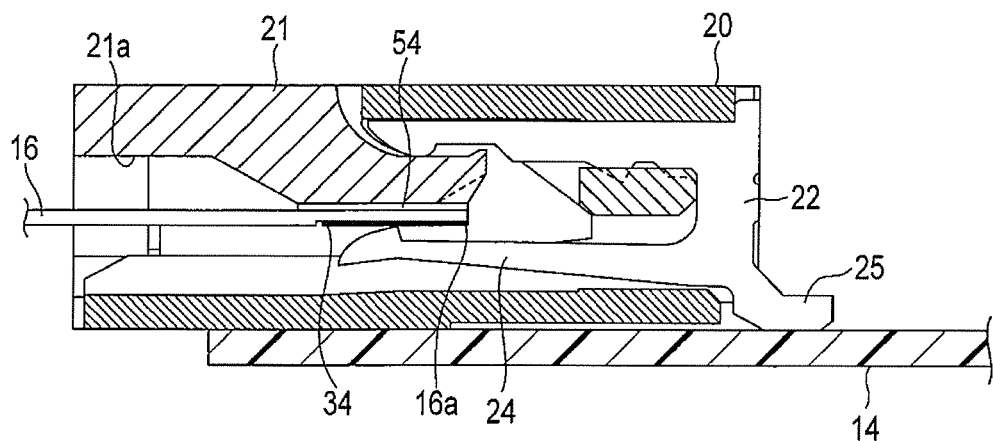
F I G. 3
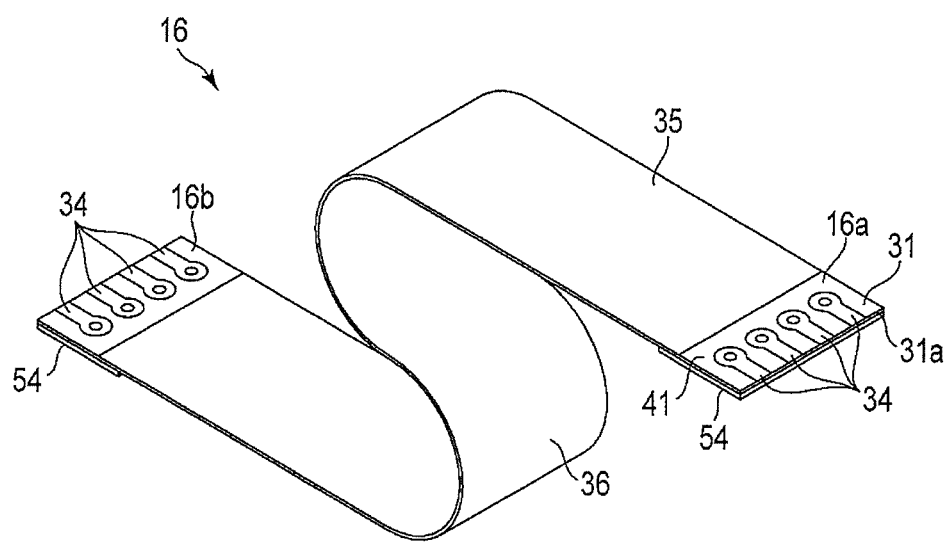
F I G. 4

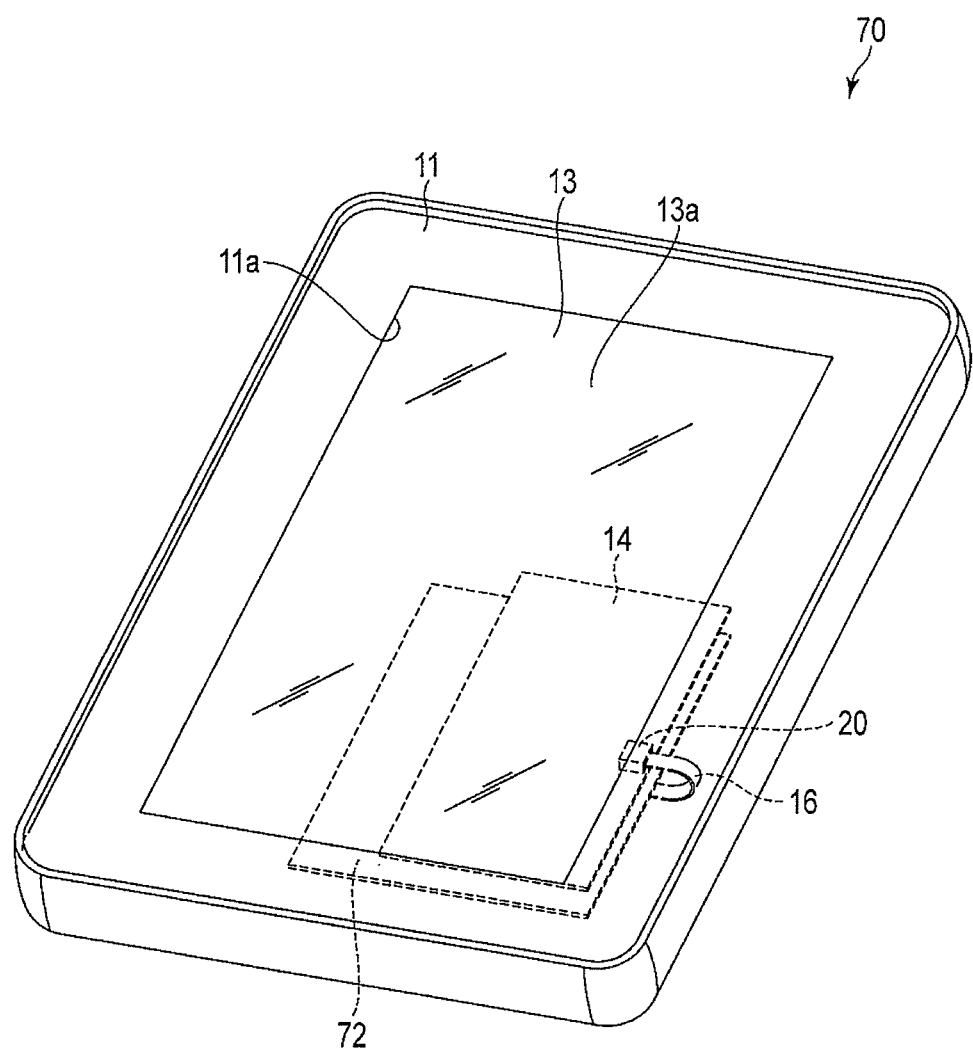
F I G. 13

TELEVISION AND ELECTRONIC APPARATUS

CROSS-REFERENCE TO RELATED APPLICATIONS

This application is based upon and claims the benefit of priority from prior Japanese Patent Application No. 2011-246513, filed Nov. 10, 2011, the entire contents of which are incorporated herein by reference.

FIELD

Embodiments described herein relate generally to a television and an electronic apparatus.

BACKGROUND

A television comprises various electronic components such as a printed circuit board, tuner, etc. These electronic components are connected to one another by a flexible cable, e.g., a flexible printed circuit board.

The cable is connected to connectors that are attached to the electronic components. The cable is reinforced by, for example, reinforcing plates, which serve to prevent conductor patterns from being bent and snapped. However, such components as cables that should be kept from snapping leave room for further improvement.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is an exemplary sectional view showing a part of the substrate of the first embodiment;

FIG. 4 is an exemplary perspective view showing the flexible cable of the first circuit;

FIG. 13 is an exemplary perspective view showing a slate-shaped portable computer according to a fifth embodiment.

DETAILED DESCRIPTION

Various embodiments will be described hereinafter with reference to the accompanying drawings.

In general, according to one embodiment, an electronic apparatus includes a housing, a connector in the housing, and a component connected to the connector. The component includes a first electrically conductive portion on a first surface, a second electrically conductive portion on a second surface, a third electrically conductive portion on the first surface, a first cover portion, and a second cover portion. The second electrically conductive portion is electrically connected to the first electrically conductive portion. The third electrically conductive portion is kept in contact with a terminal of the connector, and electrically connected to the second electrically conductive portion. The first cover portion covers at least a part of the first electrically conductive portion. The second cover portion covers at least a part of the second electrically conductive portion.

Figure 1:
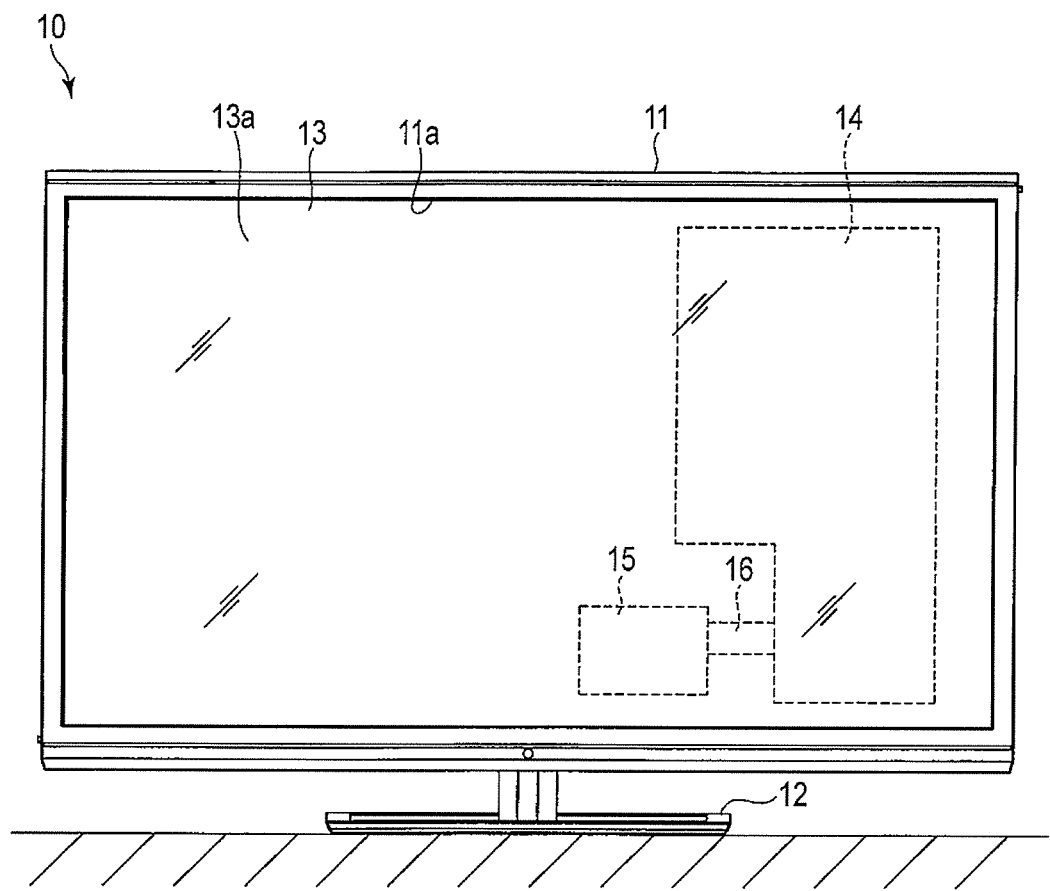
FIG. 1 is an exemplary front view showing a television according to a first embodiment.

A first embodiment will now be described with reference to FIGS. 1 to 7. FIG. 1 is an exemplary front view showing a television 10 according to the first embodiment. The television 10 is an element that can be alternatively expressed, for example, as a receiver, display unit, display, or monitor. As shown in FIG. 1, the television 10 comprises a housing 11, pedestal stand 12, display module 13, substrate 14, storage 15, and flexible cable 16. The housing 11 is an element that can be alternatively expressed, for example, as an outer casing part, container part, or wall portion. The display module 13 is an element that can be alternatively expressed, for example, as a display section, display unit, module, or electronic component. The substrate 14 is an example of an electronic component. The substrate 14 is an element that can be alternatively expressed, for example, as a flat component, circuit board, or electronic component. The storage 15 is an element that can be alternatively expressed, for example, as an electronic component, alternative component, or adaptation equipment. The flexible cable 16 is an example of a flexible cable and a component. The flexible cable 16 is an element that can be alternatively expressed, for example, as a cable, flexible component, flat component, connector, connecting component, circuit board, or substrate.

The housing 11 is in the form of a flat box. An opening 11a is disposed in the front of the housing 11. The pedestal stand 12 is attached to the back of the housing 11 and supports the housing 11.

The display module 13 is accommodated in the housing 11. The display module 13 is, for example, a liquid-crystal display, which comprises a display section 13a configured to display images. The display module 13 may be of some other type, such as a plasma display or organic electroluminescent display (OELD). The display section 13a of the display module 13 is exposed from the opening 11a of the housing 11.

The substrate 14, storage 15, and flexible cable 16 are accommodated in the housing 11, as indicated by broken lines in FIG. 1. In other words, these three components are present in the housing 11. The substrate 14 is, for example, a rigid printed circuit board on which various components, such as a capacitor, are mounted. The substrate is not limited to this and may be of some other type, such as a flexible printed circuit board.

The storage 15 is, for example, an HDD for storing recorded data. The substrate 14 and storage 15 are connected to each other by the flexible cable 16. In other words, the storage 15 is joined to the substrate 14 by the flexible cable 16.

Figure 2:
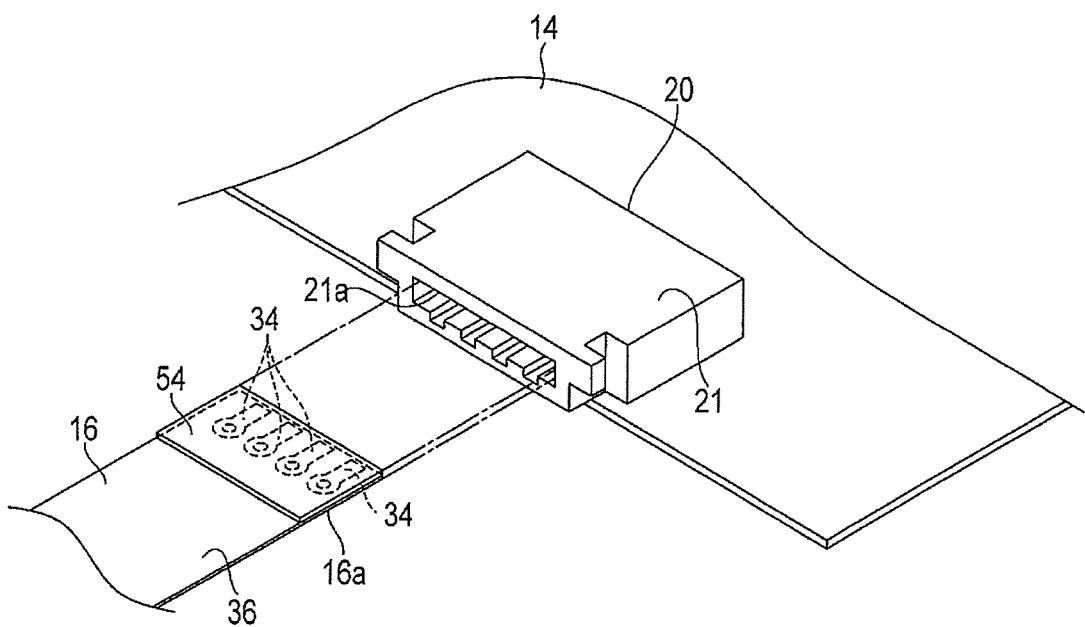
FIG. 2 is an exemplary perspective view showing a part of a substrate and a part of a flexible cable of the first embodiment.

FIG. 2 is an exemplary perspective view showing a part of the substrate 14 and a part of the flexible cable 16. FIG. 3 is an exemplary sectional view showing a part of the substrate 14. As shown in FIG. 2, a connector 20 is mounted on an end portion of the substrate 14. The connector 20 is an element that can be alternatively expressed, for example, as a component, junction, connecting component, fixing portion, or fitting portion. As shown in FIG. 3, the connector 20 comprises a case 21 and a plurality of terminals 22. The terminals 22 are parts for connection.

As shown in FIG. 2, the case 21 is in the form of a flat box and is secured to the substrate 14. The case 21 comprises an insertion hole 21a. The shape of the insertion hole 21a corresponds to that of the flexible cable 16.

As shown in FIG. 3, each terminal 22 comprises a contact portion 24 located in the case 21 and a junction 25 extending outside the case 21. The contact portion 24 is an element that can be alternatively expressed, for example, as a terminal, electrically conductive portion, current-carrying portion, nipping portion, pressure portion, or attachment part. The contact portion 24 is elastically displaceable in the case 21. The junction 25 is connected to, for example, a pad formed on the surface of the substrate 14.

The flexible cable 16 is connected to the connector 20. In other words, the flexible cable 16 is attached to the connector 20. The cable 16 is inserted into the case 21 through the insertion hole 21a. In the case 21, the cable 16 is held between the contact portion 24 of the terminal 22 and the inner surface of the case 21. That part which holds the flexible cable 16 is not limited to the inner surface of the case 21 and may be a separate component from the case 21. This component is an element that can be alternatively expressed, for example, as a nipping portion or abutting portion.

Figure 5:
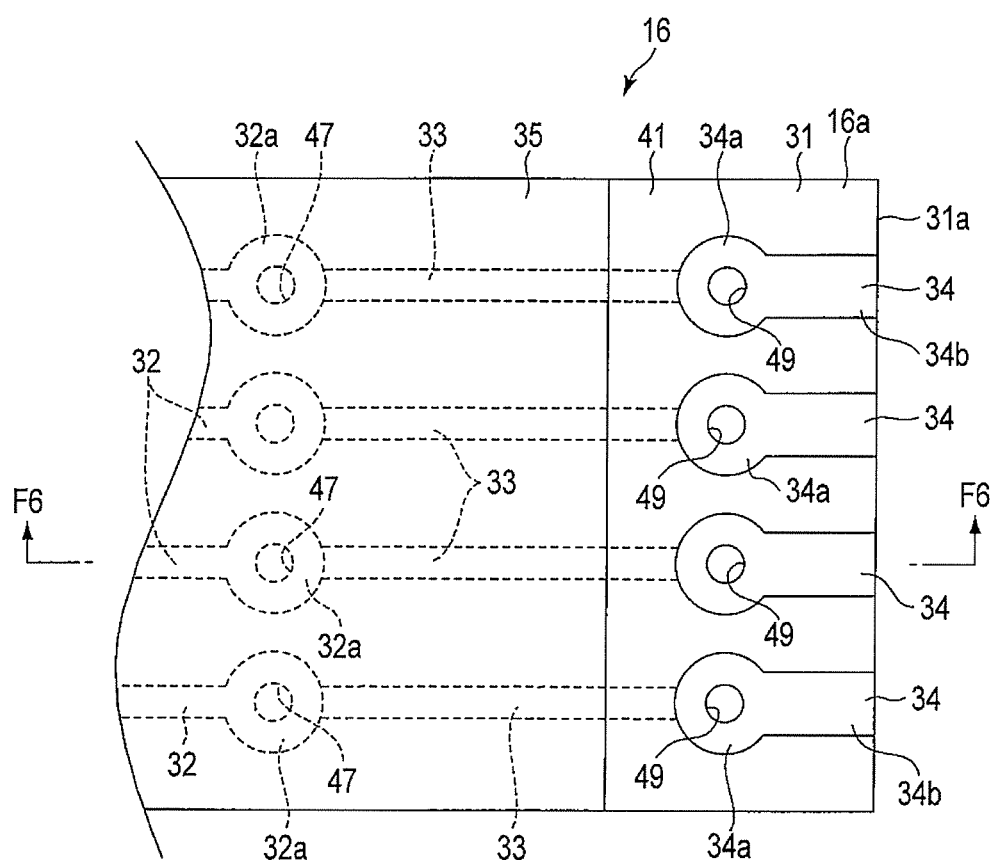
FIG. 5 is an exemplary plan view showing a part of the flexible cable of the first embodiment.
Figure 6:
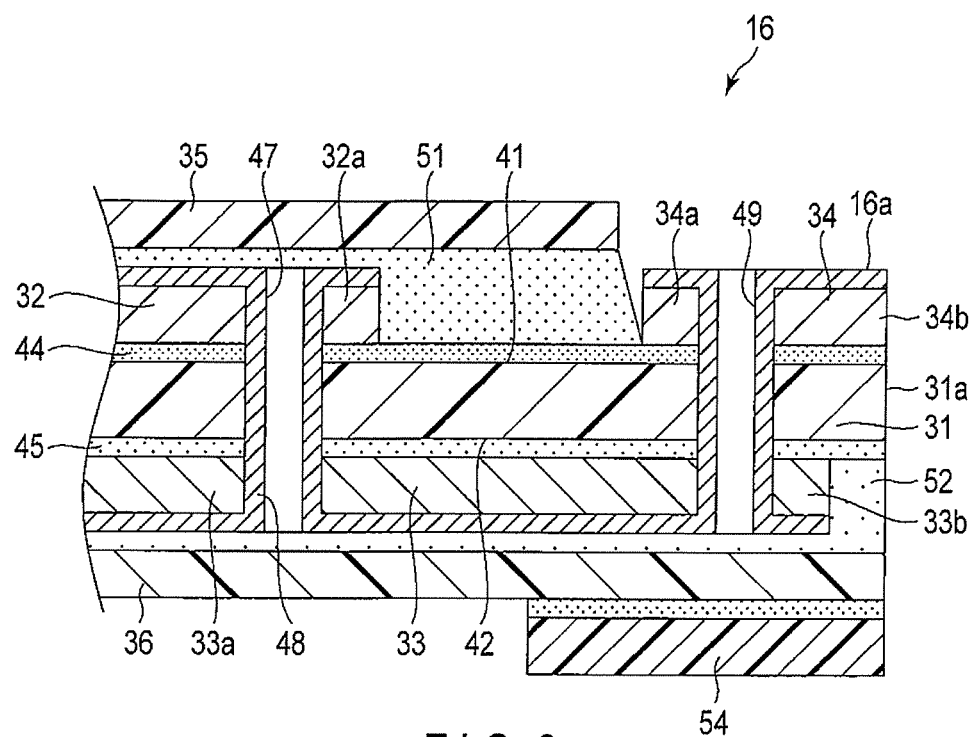
FIG. 6 is an exemplary sectional view of the flexible cable of the first embodiment taken along line F6-F6 of FIG. 5.

FIG. 4 is an exemplary perspective view showing the flexible cable 16, and FIG. 5 is an exemplary plan view showing a part of the cable 16. FIG. 6 is an exemplary sectional view of the cable 16 taken along line F6-F6 of FIG. 5.

As shown in FIG. 4, the flexible cable 16 is a flexible printed circuit board. However, the flexible cable is not limited to this. The cable 16 is rectangular in shape. Terminal parts 16a and 16b that are connected to the connector 20 and storage 15 are respectively disposed on the opposite end portions of the flexible cable 16. The terminal parts 16a and 16b are parts in which electrically conductive patterns are exposed. The terminal part 16a is connected to the connector 20, and the other terminal part 16b is connected to the storage 15.

As shown in FIG. 6, the flexible cable 16 comprises a base portion 31, first conductor patterns 32, second conductor patterns 33, terminal patterns 34, first cover portion 35, and second cover portion 36. The base portion 31 is an element that can be alternatively expressed, for example, as a flat component, flexible component, foundation, or film portion. The first conductor patterns 32 are an example of first conductor patterns and first electrically conductive portions. The second conductor patterns 33 are an example of second conductor patterns and second electrically conductive portions. The terminal patterns 34 are an example of terminal patterns and third electrically conductive portions. The first and second conductor patterns 32 and 33 and terminal patterns 34 are elements that can be alternatively expressed, for example, as electrically conductive parts, electrically conductive thin films, or current-carrying parts. The first and second cover portions 35 and 36 are elements that can be alternatively expressed, for example, as insulating portions, laminate portions, or covering portions.

The base portion 31 is a base film of, for example, polyimide. However, the base portion is not limited to this and may be a base film of polyester, laminate plate, or some other component.

The base portion 31 is a part of the rectangular flexible cable 16, for example. The base portion 31 comprises a first surface 41 and second surface 42. The second surface 42, which is not continuous with the first surface 41, is located opposite the first surface.

The first conductor patterns 32 are disposed on the first surface 41 of the base portion 31. The first conductor patterns 32 are, for example, copper foils that are bonded to the first surface 41 with a first insulating adhesive 44 and are patterned by etching. The first adhesive 44 is an element that can be alternatively expressed, for example, as an adhesive portion, adhesive layer, or insulating part. One end portion 32a of each first conductor pattern 32 is spaced apart from one end portion 31a of the base portion 31.

The second conductor patterns 33 are disposed on the second surface 42 of the base portion 31. The second conductor patterns 33 are, for example, copper foils that are bonded to the second surface 42 with a second insulating adhesive 45 and are patterned by etching. The second adhesive 45 is an element that can be alternatively expressed, for example, as an adhesive portion, adhesive layer, or insulating part.

As shown in FIG. 6, one part 33a of each second conductor pattern 33 is located in a position where it overlaps the one end portion 32a of its corresponding first conductor pattern 32 with the base portion 31 therebetween. The one end portion 32a of the first conductor pattern 32 is a partial element that can be alternatively expressed, for example, as a part, a circular part or connecting part. The one part 33a of the second conductor pattern 33 and the one end portion 32a of the first conductor pattern 32 are electrically connected to each other by a first through-hole 47. The one part 33a of the second conductor pattern 33 is an element that can be alternatively expressed, for example, as a circular part or connecting part. The first through-hole 47 is an element that can be alternatively expressed, for example, as a junction, electrical junction, through-junction, or interlayer junction. Specifically, a hole is provided that penetrates the base portion 31, one end portion 32a of the first conductor pattern 32, and one part 33a of the second conductor pattern 33, and a plated portion 48 is formed on the inner surface of the hole. In this arrangement, the first and second conductor patterns 32 and 33 are electrically connected to each other. The plated portion 48 is, for example, an electrically conductive plated part, e.g., a copper-plated part.

The means for the electrically connecting the first and second conductor patterns 32 and 33 is not limited to the first through-hole 47. For example, the conductor patterns 32 and 33 may be electrically connected by means of an alternative via-hole or electrically conductive component.

Each second conductor pattern 33 extends from its one part 33a toward the end portion 31a of the base portion 31. The second conductor pattern 33 may be directed toward the end portion 31a of the base portion 31 through a path that extends away from the end portion 31a.

The terminal patterns 34 are disposed on the first surface 41 of the base portion 31. The terminal patterns 34 are, for example, copper foils that are bonded to the first surface 41 with the first adhesive 44 and are patterned by etching. The first and second conductor patterns 32 and 33 and terminal patterns 34 may be formed of another type of conductor, such as an electrically conductive adhesive. Further, these members may be parts other than linear ones.

One end portion 34a of each terminal pattern 34 is spaced apart from the one end portion 32a of each first conductor pattern 32. Further, the one end portion 34a of the terminal pattern 34 is located in a position where it overlaps the other part 33b of its corresponding second conductor pattern 33 with the base portion 31 therebetween. The one end portion 34a of the terminal pattern 34 is a partial element that can be alternatively expressed, for example, as a part, a circular part or connecting part. The other part 33b of the second conductor pattern 33 is an element that can be alternatively expressed, for example, as a circular part or connecting part.

The one end portion 34a of each terminal pattern 34 and the other part 33b of its corresponding second conductor pattern 33 are electrically connected to each other by a second through-hole 49. The second through-hole 49 is an element that can be alternatively expressed, for example, as a junction, electrical junction, through-junction, or interlayer junction. Specifically, a hole is provided that penetrates the base portion 31, other part 33b of the second conductor pattern 33, and one end portion 34a of the terminal pattern 34, and the plated portion 48 is formed on the inner surface of the hole. In this arrangement, the second conductor pattern 33 and terminal pattern 34 are electrically connected to each other.

The other end portion 34b of each terminal pattern 34 is located at the end portion 31a of the base portion 31. Thus, the terminal pattern 34 extends from the one end portion 34a toward the end portion 31a of the base portion 31.

The terminal patterns 34 are respectively disposed in correspondence with the terminals 22. As shown in FIG. 5, the terminal patterns 34 are arranged transversely relative to the base portion 31 at substantially regular intervals.

As shown in FIG. 3, the contact portion 24 of each terminal 22 of the connector 20 contacts its corresponding terminal pattern 34. In other words, the terminal pattern 34 contacts the contact portion 24 of each terminal 22.

As shown in FIG. 5, the first and second conductor patterns 32 and 33 are equal in width and narrower than the terminal patterns 34. In other words, the conductor patterns 32 and 33 are more slender than the terminal patterns 34. Therefore, the characteristic impedance of the conductor patterns 32 and 33 is higher than that of the terminal patterns 34. The wider the patterns, the lower their characteristic impedance is, and vice versa. The first conductor patterns 32 are longer than the terminal patterns 34.

The first cover portion 35 is a cover film of, for example, polyimide. The first cover portion 35 is laminated to the first surface 41 so that it covers all the first conductor patterns 32. In other words, the first cover portion 35 overlaps the first surface 41. The terminal patterns 34 are exposed to the outside by virtue of not being covered by the first cover portion 35. In other words, the first conductor patterns 32 are arranged extending to just this side of each edge of the first cover portion 35.

As shown in FIG. 6, the first cover portion 35 is affixed to the first conductor pattern 32 and the first surface 41 of the base portion 31 with a third insulating adhesive 51. The third adhesive 51 is an element that can be alternatively expressed, for example, as an adhesive portion, adhesive layer, or insulating part. The second through-hole 49 is located at a distance from the first cover portion 35. The first cover portion 35 may be designed to cover a part of the terminal pattern 34.

The third adhesive 51 adheres to the first surface 41 of the base portion 31 from which the copper foil is removed by etching. Thus, the third adhesive 51 is interposed between the one end portion 32a of the first conductor pattern 32 and the one end portion 34a of the terminal pattern 34. In other words, the third adhesive 51 is located between the first conductor pattern 32 and terminal pattern 34.

The second cover portion 36 is a cover film of, for example, polyimide. The second cover portion 36 is laminated to the second surface 42 so that it covers all the second conductor patterns 33. In other words, the second cover portion 36 overlaps the second surface 42.

The second cover portion 36 is affixed to the second conductor pattern 33 and the second surface 42 of the base portion 31 with a fourth insulating adhesive 52. The fourth adhesive 52 is an element that can be alternatively expressed, for example, as an adhesive portion, adhesive layer, or insulating part. The second cover portion 36 may be designed to cover a part of the second conductor pattern 33.

The plated portion 48 is disposed on each of the respective surfaces of first and second conductor patterns 32 and 33 and terminal patterns 34, as well as the respective inner surfaces of the first and second through-holes 47 and 49.

Reinforcing portions 54 are affixed to the second cover portion 36. The reinforcing portions 54 are elements that can be alternatively expressed, for example, as plates, flat components, rigid attachments, or spacers. The reinforcing portions 54 are rectangular plates of, for example, polyimide. Alternatively, the reinforcing portions 54 may be formed from another material that is more rigid than polyimide, for example. Further, the reinforcing portions 54 may be, for example, a part of the second cover portion 36.

The reinforcing portions 54 are located overlapping the terminal patterns 34. The reinforcing portions 54 serve to make those parts of the flexible cable 16 which are located in correspondence with them more rigid than the other parts of the cable 16.

The thickness of those parts of the flexible cable 16 which are fitted with the reinforcing portions 54 is increased. Thus, the thickness of the cable 16 corresponds to the diameter of the insertion hole 21a of the case 21 of the connector 20.

The first conductor patterns 32 and terminal patterns 34 are located off those parts of the first surface 41 of the base portion 31 which overlap edges of the reinforcing portions 54. In other words, the edges of the reinforcing portions 54 overlap those parts located between the first conductor patterns 32 and terminal patterns 34.

When the flexible cable 16 is connected to the connector 20, as shown in FIG. 3, the reinforcing portion 54 abuts the inner surface of the case 21. When the respective contact portions 24 of the terminals 22 of the connector 20 abuts the terminal patterns 34 of the flexible cable 16, the reinforcing portion 54 is pressed against the inner surface of the case 21. Thus, the flexible cable 16 is pinched between the inner surface of the case 21 and the terminals 22 of the connector 20.

The following is a description of an example of a manufacturing method for the flexible cable 16. First, foils of, for example, rolled copper are respectively laminated to the first and second surfaces 41 and 42 of the base portion 31. The first or second adhesive 44 or 45 is applied to each of the copper foils. Then, holes are bored through those parts of the resulting structure in which the first and second through-holes 47 and 49 are to be formed by means of, for example, a drill.

Subsequently, the copper foils are partially removed by etching, whereupon the first and second conductor patterns 32 and 33 and terminal patterns 34 are formed. The first conductor patterns 32 are separated from the terminal patterns 34 by the etching. Thereafter, the respective inner surfaces of the holes are plated to form the plated portion 48, whereby the first and second through-holes 47 and 49 are formed.

Then, the first cover portion 35 with the third adhesive 51 thereon is laminated to the first surface 41, and the second cover portion 36 with the fourth adhesive 52 thereon to the second surface 42. The base portion 31 and first and second cover portions 35 and 36 are pressed so that the cover portions 35 and 36 are bonded to the base portion 31.

Then, surplus parts of the base portion 31 are cut off, whereupon the flexible cable 16 is formed. Thereafter, the reinforcing portions 54 are respectively affixed to those parts of the second cover portion 36 which overlap the terminal patterns 34.

Figure 7:
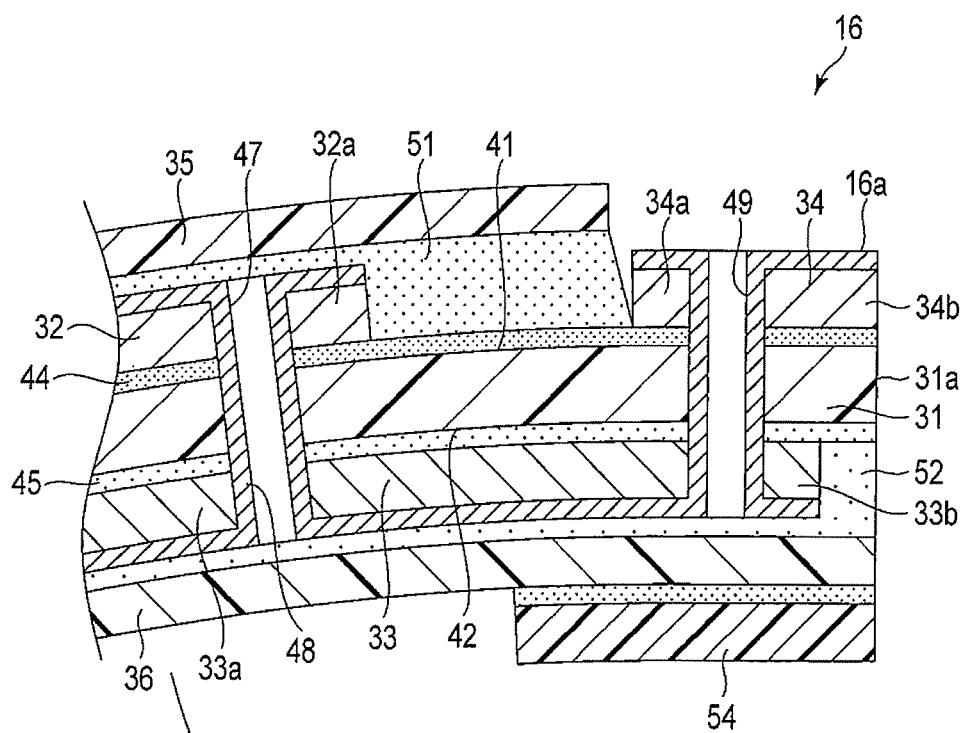
FIG. 7 is an exemplary sectional view showing the flexible cable in a bent state.

FIG. 7 is an exemplary sectional view showing the flexible cable 16 in a bent state. The flexible cable 16 with the above-described configuration may sometimes be bent in the manner indicated by the arrow in FIG. 7 by an operator who is to connect the flexible cable 16 to the connector 20.

If the flexible cable 16 is bent in the manner shown in FIG. 7, its outer parts, that is, the first conductor patterns 32 and terminal patterns 34, are pulled. Since the first conductor patterns 32 are separated from the terminal patterns 34 on the first surface 41, however, tensile forces that respectively act on them are relieved. Thus, the first conductor patterns 32 and terminal patterns 34 can be kept from snapping. Since the flexible cable 16 with this configuration requires neither modification nor addition of manufacturing processes, an increase in its manufacturing cost is suppressed.

The edges of the reinforcing portions 54 overlap those parts located between the first conductor patterns 32 and terminal patterns 34. Thus, the tensile forces that act on the first conductor patterns 32 and terminal patterns 34 can be suppressed, so that the patterns 32 and 34 are kept from snapping.

The first conductor patterns 32 and terminal patterns 34 are electrically connected to their corresponding second conductor patterns 33 on the second surface 42. Even though the first conductor patterns 32 are separated from the terminal patterns 34, therefore, these patterns 32 and 34 are electrically connected to one another.

The first and second conductor patterns 32 and 33 are more slender than the terminal patterns 34. Therefore, the characteristic impedance of the conductor patterns 32 and 33 is increased, so that high-speed transmission is achieved. Since the terminal patterns 34 are wider than the conductor patterns 32 and 33, moreover, contact failure between the terminal patterns 34 and the contact portions 24 of the terminals 22 of the connector 20 is suppressed. Even though the first and second conductor patterns 32 and 33 are made narrower as described above, furthermore, the first conductor patterns 32 are kept from snapping.

The second cover portion 36 is fitted with the reinforcing portions 54 in the positions where it overlaps the terminal patterns 34. Thus, the terminal patterns 34 are kept from being bent and snapped. If the flexible cable 16 is bent in the direction opposite to that of the arrow in FIG. 7, moreover, the reinforcing portions 54 suppress tensile forces that act on the second conductor patterns 33. Thus, the second conductor patterns 33 are kept from snapping.

The first cover portion 35 covers all the first conductor patterns 32. Even if the flexible cable 16 is bent in the manner shown in FIG. 7, therefore, the tensile forces that act on the first conductor patterns 32 are suppressed. Further, the first conductor patterns 32 are spaced apart from the edge of the first cover portion 35 on which stress is liable to be concentrated. In other words, the electrically conductive portions on the first surface 41 are arranged via the second surface 42 without contacting the edges of the first cover portion 35. Thus, the first conductor patterns 32 are kept from snapping.

The first and second conductor patterns 32 and 33 are electrically connected to one another through the first through-holes 47. Thus, the electrical connection between the conductor patterns 32 and 33 is easy.

The second conductor patterns 33 and terminal patterns 34 are electrically connected to one another through the second through-holes 49. Thus, the electrical connection between the patterns 33 and 34 is easy.

The third insulating adhesive 51 is interposed between the first conductor patterns 32 and terminal patterns 34. Thus, the patterns 32 and 34 are prevented from contacting one another. By means of the third adhesive 51 with which the first cover portion 35 is bonded to the first surface 41, the first conductor patterns 32 are easily insulated from the terminal patterns 34, so that an increase in the manufacturing cost of the flexible cable 16 is suppressed.

The terminal patterns 34 are spaced apart from the first cover portion 35. Thus, the area of the exposed terminal patterns 34 are prevented from being reduced, so that the contact between the terminal patterns 34 and the terminals 22 of the connector 20 is kept from being damaged.

In the embodiment described above, the flexible cable 16 connects the substrate 14 and storage 15. Alternatively, however, it may be designed to connect two substrates, for example.

A second embodiment will now be described with reference to FIGS. 8 and 9. In the description of the embodiment to follow, like reference numbers are used to designate like constituent parts having the same functions as those of the television 10 of the first embodiment. Further, a description of those constituent parts may be partially or entirely omitted.

Figure 8:
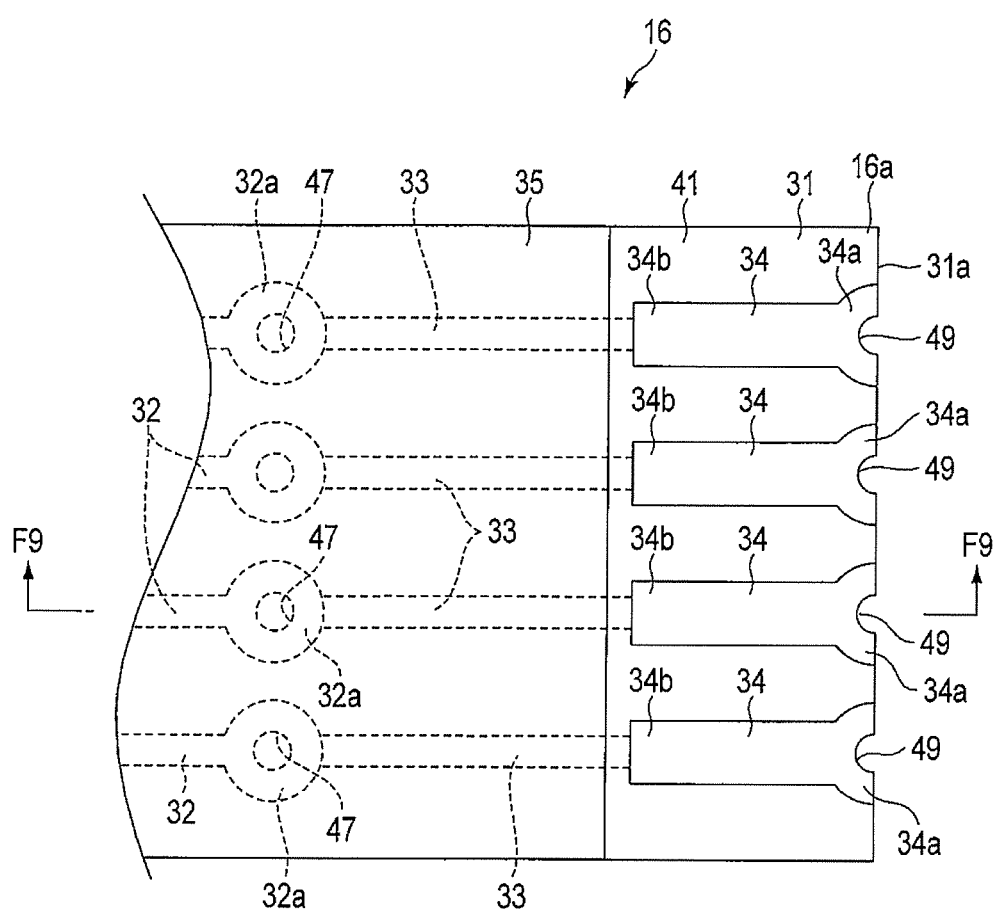
FIG. 8 is an exemplary plan view showing a part of a flexible cable according to a second embodiment.
Figure 9:
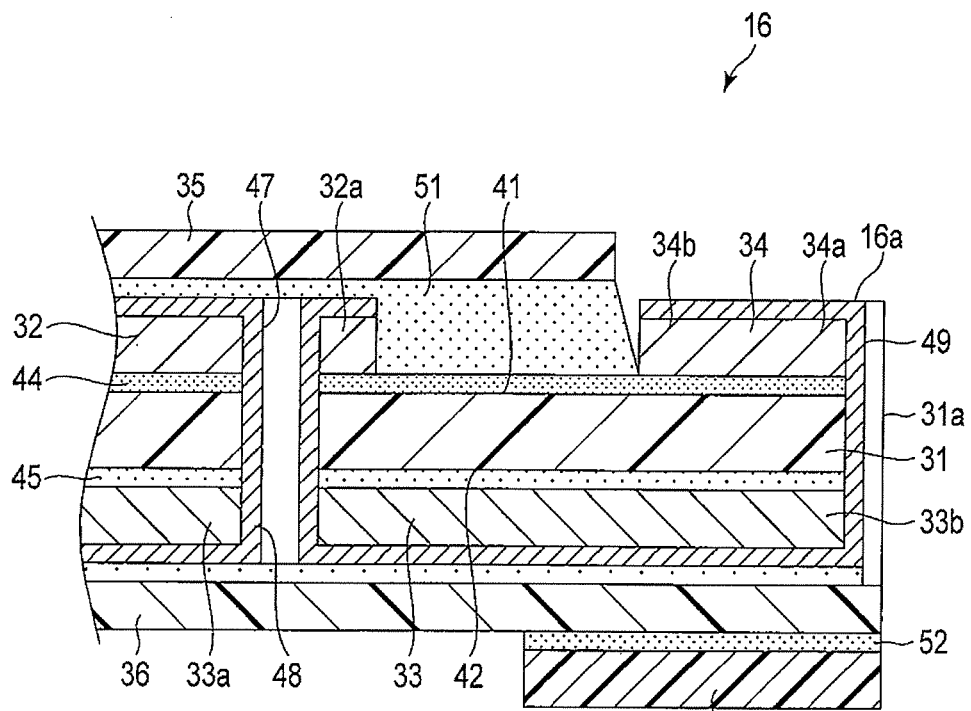
FIG. 9 is an exemplary sectional view of the flexible cable of the second embodiment taken along line F9-F9 of FIG. 8.

FIG. 8 is an exemplary plan view showing a part of a flexible cable 16 according to the second embodiment. FIG. 9 is an exemplary sectional view of the cable 16 taken along line F9-F9 of FIG. 8. As shown in FIGS. 8 and 9, second through-holes 49 of the second embodiment are formed at an end portion 31a of a base portion 31.

Each second through-hole 49 is, for example, halved. As shown in FIG. 9, it is formed such that a notch is disposed along the base portion 31, the other part 33b of a second conductor pattern 33, and one end portion 34a of a terminal pattern 34 and a plated portion 48 is disposed on the inner surface of the notch. The notch can be alternatively expressed, for example, as a groove, recess, or the like. The second conductor pattern 33 and terminal pattern 34 are electrically connected to each other by the second through-hole 49.

In the second embodiment, the one end portion 34a of the terminal pattern 34 is located at the end portion 31a of the base portion 31. Correspondingly, the other part 33b of the second conductor pattern 33 is also located at the end portion 31a of the base portion 31.

The other end portion 34b of the terminal pattern 34 is located nearer to a first cover portion 35 than the one end portion 34a. Thus, the terminal pattern 34 extends from the one end portion 34a toward the first cover portion 35.

For example, each second through-hole of the second embodiment is formed in the following manner. In a manufacturing process for the flexible cable 16 described above, each hole in the base portion 31 is divided by cutting off a surplus part of the base portion 31. Thus, the hole in the base portion 31 is changed to a notch. The plated portion 48 is formed by plating the inner surface of the notch along with that of a first through-hole 47. The second through-hole 49 of the second embodiment is formed in this way.

According to a television 10 constructed in this manner, as in the first embodiment, first conductor patterns 32 are separated from the terminal patterns 34 on the first surface 41. Accordingly, tensile forces that respectively act on them are relieved. Thus, the first conductor patterns 32 and terminal patterns 34 are kept from snapping.

The second through-hole 49 is disposed at the end portion 31a of the base portion 31. The one end portion 34a of the terminal pattern 34 is secured to the end portion 31a of the base portion 31 by the plated portion 48. Thus, the terminal pattern 34 is kept from coming off the base portion 31.

Figure 10:
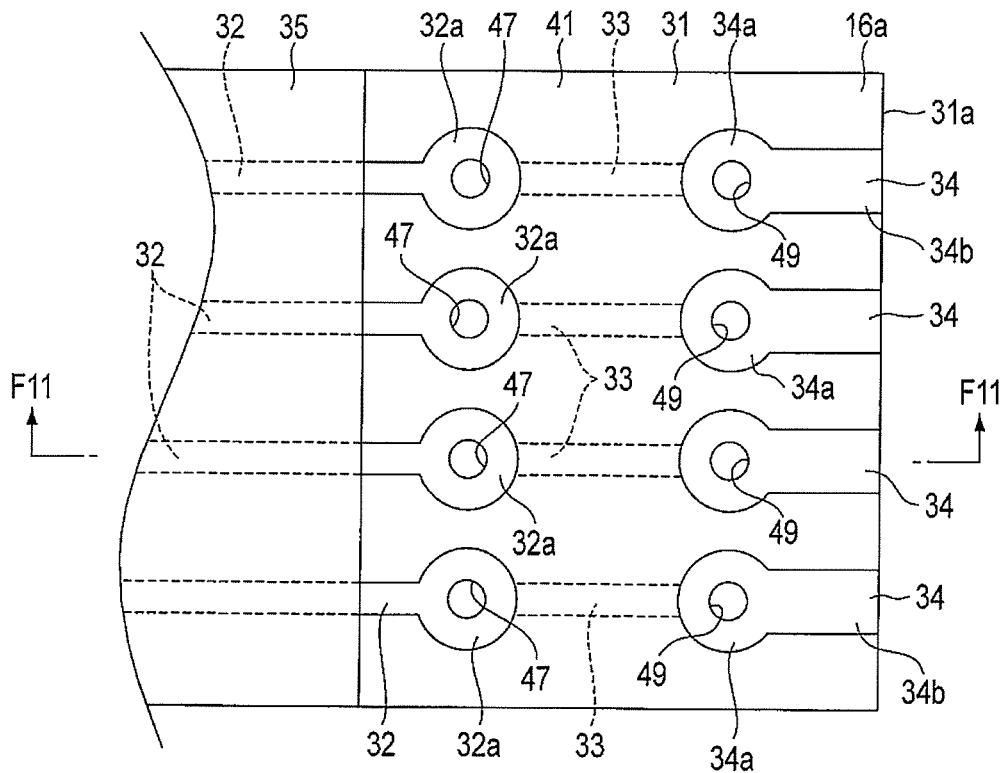
FIG. 10 is an exemplary plan view showing a part of a flexible cable according to a third embodiment.
Figure 11:
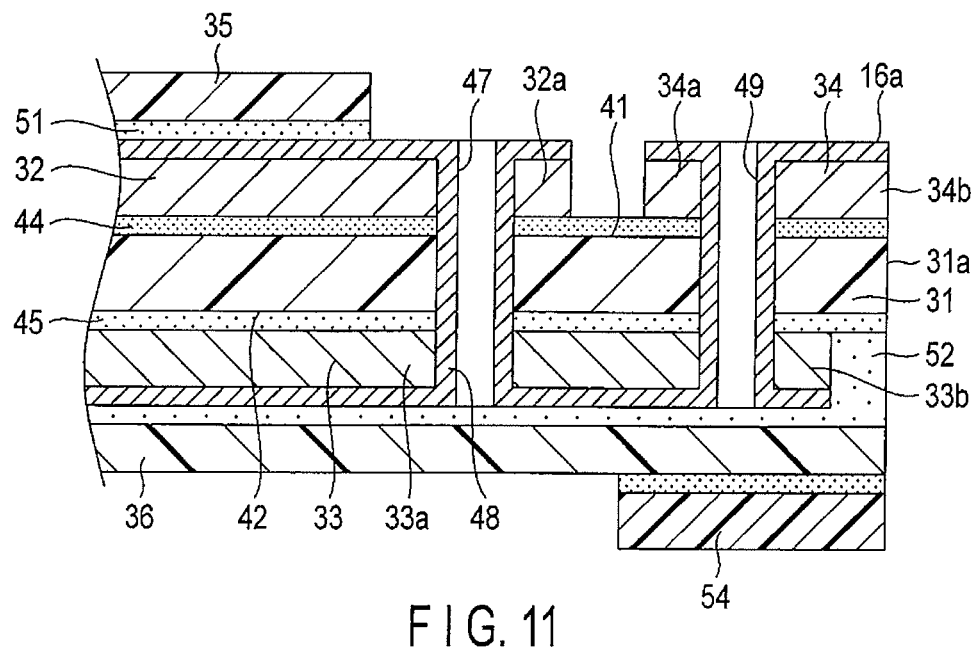
FIG. 11 is an exemplary sectional view of the flexible cable of the third embodiment taken along line F11-F11 of FIG. 10.

A third embodiment will now be described with reference to FIGS. 10 and 11. FIG. 10 is an exemplary plan view showing a part of a flexible cable 16 according to the third embodiment. FIG. 11 is an exemplary sectional view of the cable 16 taken along line F11-F11 of FIG. 10.

As shown in FIG. 10, a first cover portion 35 covers a part of each of first conductor patterns 32. That part of the first conductor pattern 32 which includes an end portion 32a is exposed to the outside.

According to a television 10 constructed in this manner, as in the first embodiment, the first conductor patterns 32 are separated from terminal patterns 34 on a first surface 41. Accordingly, tensile forces that respectively act on them are relieved. Thus, the first conductor patterns 32 and terminal patterns 34 are kept from snapping.

Figure 12:
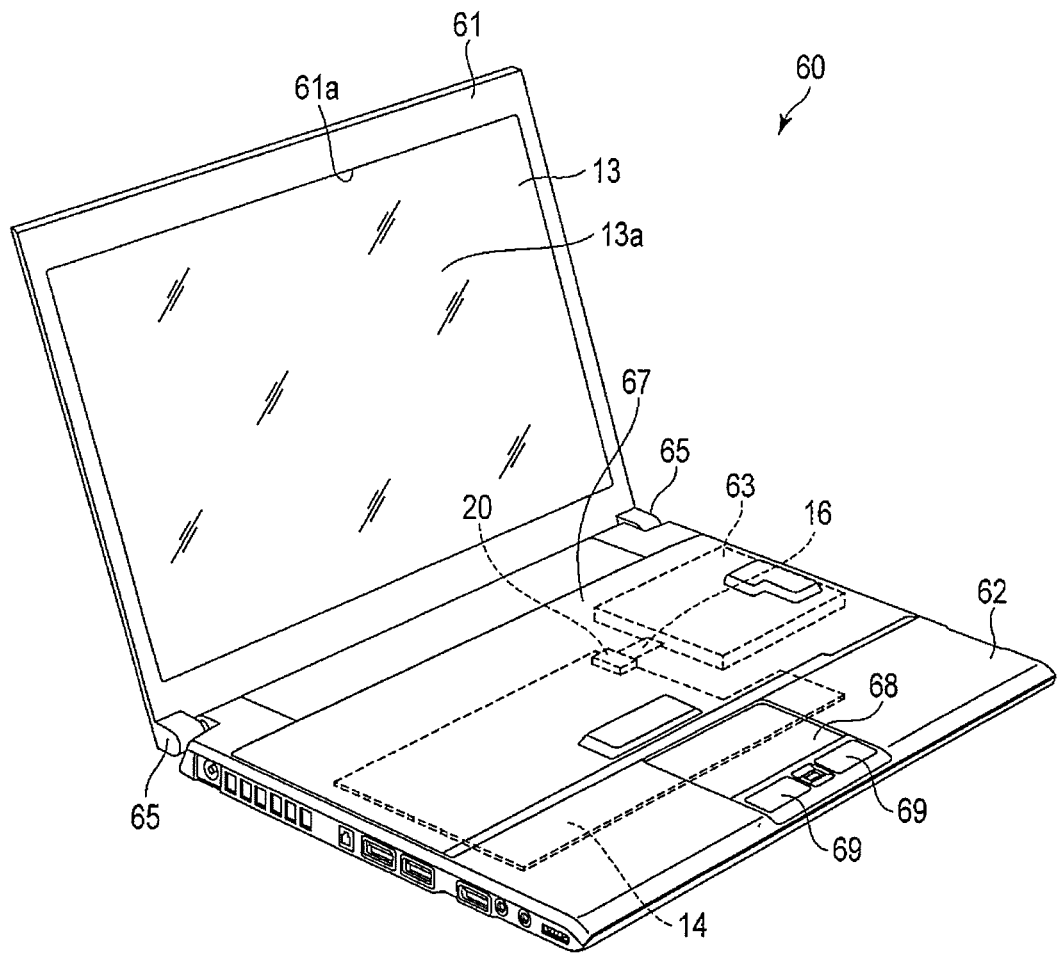
FIG. 12 is an exemplary perspective view showing a portable computer according to a fourth embodiment.

A fourth embodiment will now be described with reference to FIG. 12. FIG. 12 is an exemplary perspective view showing a portable computer 60 according to the fourth embodiment. The portable computer 60 is an example of an electronic apparatus, which can be alternatively expressed, for example, as a notebook computer, personal computer, mobile computer, or terminal. As shown in FIG. 12, the portable computer 60 comprises a first housing 61, second housing 62, display module 13, substrate 14, flexible cable 16, and optical disc drive 63. The first and second housings 61 and 62 are elements that can be alternatively expressed, for example, as outer parts, container parts, or wall portions. The second housing 62 is an example of a housing. The optical disc drive 63 is an element that can be alternatively expressed, for example, as an electronic component, alternative component, or adaptation equipment.

The first housing 61 is in the form of a flat box. The first housing 61 pivotably mounted on the rear end portion of the second housing 62 by a pair of hinge portions 65. The first housing 61 is pivotable between a closed position where it overlies the second housing 62 and an open position where it rises from the rear end portion of the second housing 62.

The first housing 61 accommodates the display module 13. In other words, the display module 13 is present in the first housing 61. The first housing 61 comprises an opening 61a. A display unit 13a of the display module 13 is exposed from the opening 61a.

The second housing 62 is in the form of a flat box. A keyboard 67, touchpad 68, and a pair of click buttons 69 are disposed on the top surface of the second housing 62. Some keys on the keyboard 67 are not shown in FIG. 12.

The second housing 62 accommodates the substrate 14, flexible cable 16, and optical disc drive 63. In other words, the substrate 14, flexible cable 16, and optical disc drive 63 are present in the second housing 62. The flexible cable 16 connects the substrate 14 and optical disc drive 63 to each other.

The flexible cable 16, which is identical with the flexible cable 16 of the first embodiment, is connected to a connector 20 mounted on the substrate 14. In the flexible cable 16, first conductor patterns 32 are separated from terminal patterns 34 on a first surface 41. Therefore, tensile forces that respectively act on them are relieved. Thus, the first conductor patterns 32 and terminal patterns 34 are kept from snapping. Like this, the flexible cable 16 is applicable to the portable computer 60.

In the embodiment described above, the flexible cable 16 connects the substrate 14 and optical disc drive 63. Alternatively, however, the flexible cable 16 may be designed to connect two substrates, for example.

A fifth embodiment will now be described with reference to FIG. 13. FIG. 13 is an exemplary perspective view showing a slate-shaped portable computer 70 according to the fifth embodiment. The computer 70 is an example of an electronic apparatus, which can be alternatively expressed, for example, as a tablet, plate-like module, or terminal. The computer 70 comprises a housing 11, display module 13, substrate 14, flexible cable 16, and other substrate 72. The other substrate 72 is an element that can be alternatively expressed, for example, as an electronic component, alternative component, or adaptation equipment.

The housing 11 accommodates the display module 13, substrate 14, flexible cable 16, and other substrate 72. In other words, the display module 13, substrate 14, flexible cable 16, and other substrate 72 are present in the housing 11. As indicated by broken lines in FIG. 13, the flexible cable 16 connects the substrate 14 and other substrate 72 to each other.

The flexible cable 16, which is identical with the flexible cable 16 of the first embodiment, is connected to a connector 20 mounted on the substrate 14. In the flexible cable 16, first conductor patterns 32 are separated from terminal patterns 34 on a first surface 41. Therefore, tensile forces that respectively act on them are relieved. Thus, the first conductor patterns 32 and terminal patterns 34 are kept from snapping. Like this, the flexible cable 16 is applicable to the slate-shaped portable computer 70.

In the embodiment described above, the flexible cable 16 connects the substrate 14 and other substrate 72. Alternatively, however, it may be designed to connect the substrate 14 and display module 13, for example.

According to at least one of the embodiments described herein, the first conductor patterns and terminal patterns are disposed on the first surface, and the second conductor patterns on the second surface are connected to the terminal patterns, whereby the patterns are kept from snapping.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing;
   a display module in the housing, configured to display an image;
   an electronic component in the housing, comprising a connector; and
   a flexible cable connected to the connector, the flexible cable comprising:
   a first surface;
   a second surface on an opposite side of the first surface;
   a first conductor pattern on the first surface;
   a second conductor pattern on the second surface, electrically connected to the first conductor pattern;
   a terminal pattern on the first surface, kept in contact with a terminal of the connector, and electrically connected to the second conductor pattern;
   a first cover portion laminated to the first surface so as to cover at least a part of the first conductor pattern;
   a second cover portion laminated to the second surface so as to cover the second conductor pattern; and
   an insulator disposed between the first conductor pattern and the terminal pattern.

2. The electronic apparatus of claim 1, wherein the first and second conductor patterns are more slender than the terminal pattern.

3. The electronic apparatus of claim 1, wherein the second cover portion is fitted with a reinforcing portion in a position where the reinforcing portion overlaps the second conductor pattern.

4. The electronic apparatus of claim 2, wherein the second cover portion is fitted with a reinforcing portion in a position where the reinforcing portion overlaps the second conductor pattern.

5. The electronic apparatus of claim 1, wherein an edge of the first cover portion is spaced apart from the first conductor pattern.

6. The electronic apparatus of claim 4, wherein an edge of the first cover portion is spaced apart from the first conductor pattern.

7. The electronic apparatus of claim 1, wherein the first and second conductor patterns are electrically connected to each other by a first through-hole.

8. The electronic apparatus of claim 6, wherein the first and second conductor patterns are electrically connected to each other by a first through-hole.

9. The electronic apparatus of claim 1, wherein the second conductor pattern and the terminal pattern are electrically connected to each other by a second through-hole.

10. The electronic apparatus of claim 8, wherein the second conductor pattern and the terminal pattern are electrically connected to each other by a second through-hole.

11. The electronic apparatus of claim 10, wherein the insulator is an adhesive with which the first cover portion is bonded to the first surface.

12. The electronic apparatus of claim 1, wherein the terminal pattern is spaced apart from the first cover portion.

13. The electronic apparatus of claim 11, wherein the terminal pattern is spaced apart from the first cover portion.

14. An electronic apparatus comprising:
a housing;
a connector in the housing; and
a component connected to the connector, the component comprising:
a first electrically conductive portion on a first surface;
a second electrically conductive portion on a second surface which is not continuous with the first surface, electrically connected to the first electrically conductive portion;
a third electrically conductive portion on the first surface, kept in contact with a terminal of the connector, and electrically connected to the second electrically conductive portion;
a first cover portion covering at least a part of the first electrically conductive portion;
a second cover portion covering at least a part of the second electrically conductive portion; and
an insulator disposed between the first electrically conductive portion and the third electrically conductive portion.

15. An electronic apparatus comprising:
a display module;
an electronic component coupled to the display module and configured to connect to a connector, the connector comprising one or more terminals; and
a flexible cable and configured to connect to the connector, the flexible cable comprising:
a first surface having a first conductor pattern and a first terminal pattern;
a second surface being on an opposite end portion of the flexible cable as the first surface, the second surface having a second conductor pattern configured to be electrically connected to the first conductor pattern; and
an insulating portion positioned between the first conductor pattern and the first terminal pattern, wherein the first terminal pattern is configured to maintain contact with a terminal of the connector and further configured to be electrically connectable to the second conductor pattern.

16. The electronic apparatus of claim 15, wherein the first conductor pattern and the second conductor pattern are electrically connected by a first through-hole.

17. The electronic apparatus of claim 15, wherein the second conductor pattern and the first terminal pattern are electrically connected to each other by a second through-hole.

* * * * *